(12) United States Patent
Fujitsuka et al.

(10) Patent No.: US 9,263,319 B2
(45) Date of Patent: Feb. 16, 2016

(54) SEMICONDUCTOR MEMORY DEVICE AND METHOD FOR MANUFACTURING THE SAME

(71) Applicant: Kabushiki Kaisha Toshiba, Minato-ku (JP)

(72) Inventors: Ryota Fujitsuka, Yokkaichi (JP); Fumiki Aiso, Kuwana (JP); Motoki Fujii, Yokkaichi (JP); Hiroshi Itokawa, Oita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 4 days.

(21) Appl. No.: 14/299,174

(22) Filed: Jun. 9, 2014

(65) Prior Publication Data

US 2015/0060986 A1   Mar. 5, 2015

Related U.S. Application Data

(60) Provisional application No. 61/872,056, filed on Aug. 30, 2013.

(51) Int. Cl.
| | |
|---|---|
| *H01L 29/423* | (2006.01) |
| *H01L 21/764* | (2006.01) |
| *H01L 29/788* | (2006.01) |
| *H01L 27/115* | (2006.01) |

(52) U.S. Cl.
CPC ........ *H01L 21/764* (2013.01); *H01L 27/11521* (2013.01); *H01L 29/42332* (2013.01); *H01L 29/7881* (2013.01)

(58) Field of Classification Search
None
See application file for complete search history.

(56) References Cited

U.S. PATENT DOCUMENTS

| | | | |
|---|---|---|---|
| 2012/0049288 A1* | 3/2012 | Maruyama | H01L 21/823857 257/369 |
| 2012/0126306 A1 | 5/2012 | Kawaguchi et al. | |
| 2012/0132985 A1 | 5/2012 | Kai et al. | |
| 2015/0054047 A1* | 2/2015 | Nakajima | H01L 29/66825 257/315 |

* cited by examiner

*Primary Examiner* — Yasser A Abdelaziez
(74) *Attorney, Agent, or Firm* — Oblon, McClelland, Maier & Neustadt, L.L.P.

(57) ABSTRACT

According to one embodiment, a semiconductor memory device includes a plurality of stacked bodies and a spacer film provided on a side surface of the stacked bodies. Each of the plurality of stacked bodies includes a silicon electrode and a metal electrode stacked on the metal electrode. The plurality of stacked bodies are separated from each other by an air gap. The spacer film includes silicon oxide. A portion of the spacer film disposed on a side surface of the metal electrode is thicker than a portion of the spacer film disposed on a side surface of the silicon electrode.

11 Claims, 10 Drawing Sheets

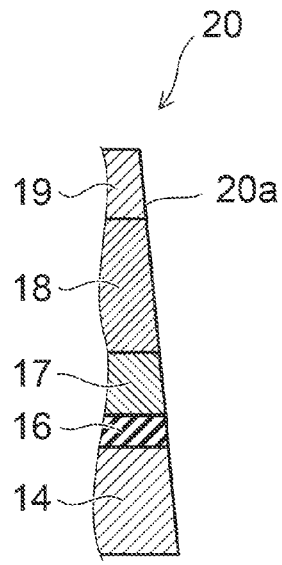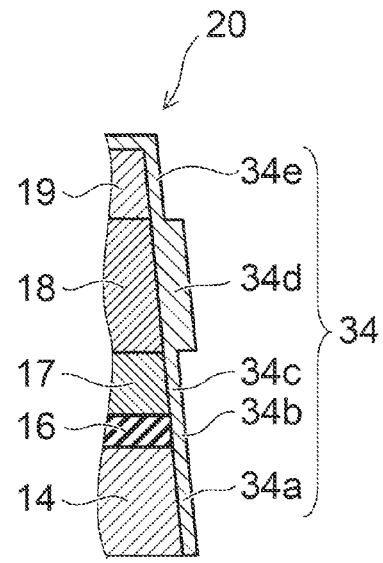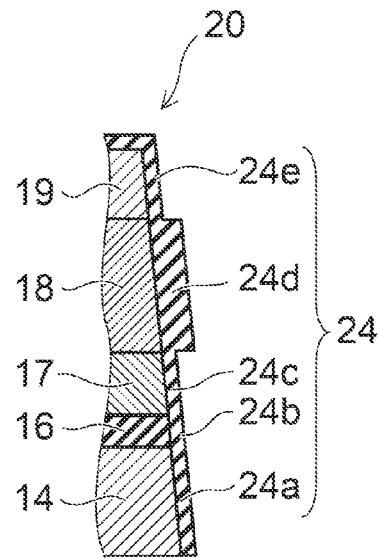
FIG. 3A        FIG. 3B        FIG. 3C
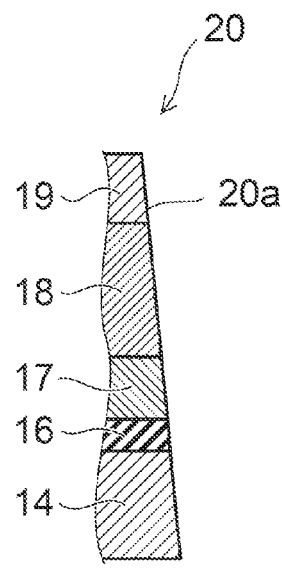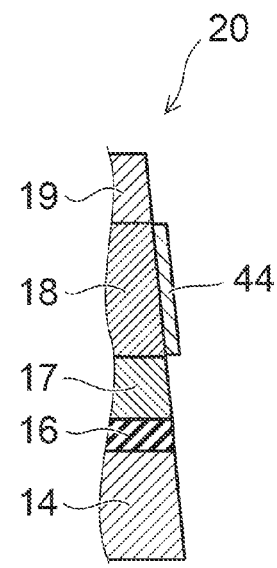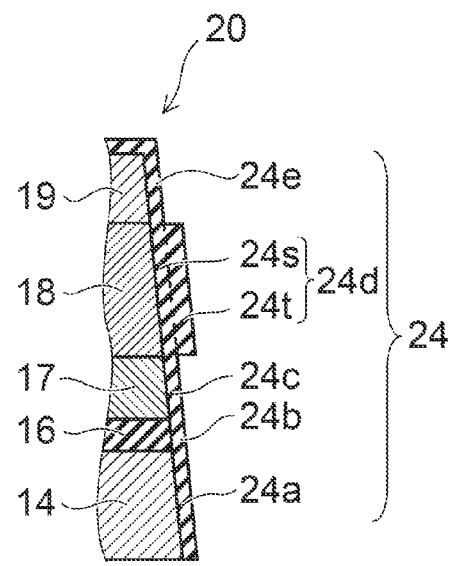
FIG. 4A        FIG. 4B        FIG. 4C

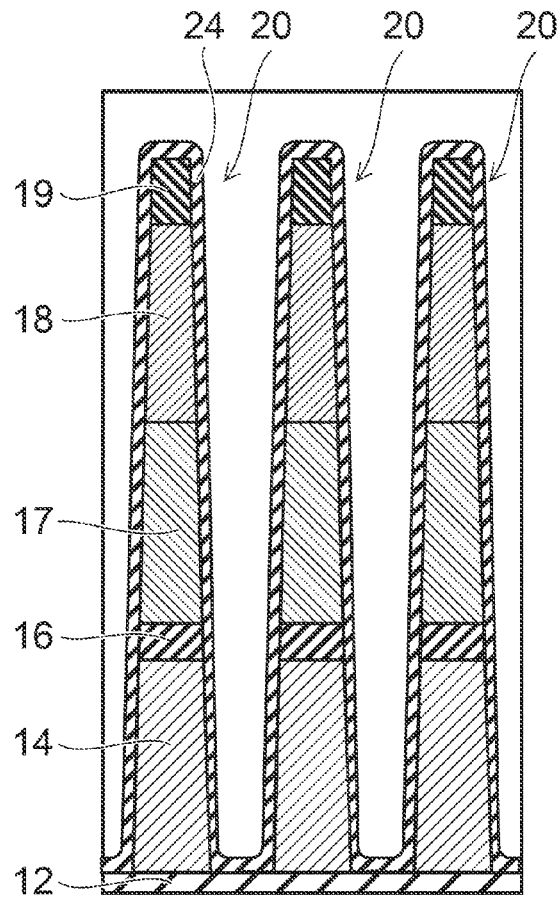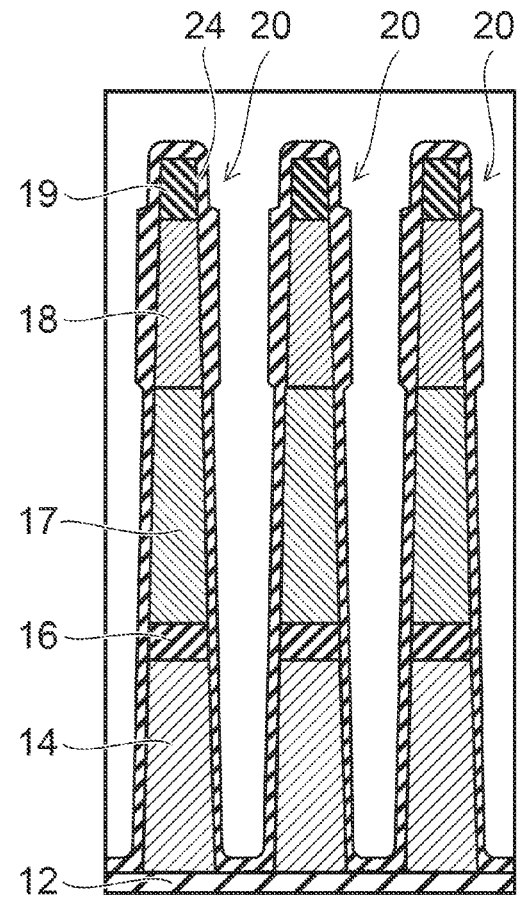
WITHOUT DISILANE FLOW
WITH DISILANE FLOW
FIG. 7A
FIG. 7B

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 61/872,056, filed on Aug. 30, 2013; the entire contents of which are incorporated herein by reference.

FIELD

Embodiments described herein relate generally to a semiconductor memory device and a method for manufacturing the same.

BACKGROUND

Conventionally, NAND flash memory has been developed as a nonvolatile semiconductor memory device. With the higher integration of NAND flash memory, interference between memory cells has become problematic. Therefore, technology that makes an air gap between the memory cells has been proposed. Technology in which a metal gate is used as the control gate electrode also has been proposed.

BRIEF DESCRIPTION OF THE DRAWINGS

FIG. 3A to FIG. 3C are cross-sectional views of processes, showing the method for manufacturing the semiconductor memory device according to the first embodiment;

FIG. 4A to FIG. 4C are cross-sectional views of processes, showing a method for manufacturing the semiconductor memory device according to a second embodiment;

FIG. 7A and FIG. 7B are cross-sectional views showing a gate stacked bodies of the test example 2 after the spacer film is formed;

DETAILED DESCRIPTION

According to one embodiment, a semiconductor memory device includes a plurality of stacked bodies and a spacer film provided on a side surface of the stacked bodies. Each of the plurality of stacked bodies includes a silicon electrode and a metal electrode stacked on the silicon electrode. The plurality of stacked bodies are separated from each other by an air gap. The spacer film includes silicon oxide. A portion of the spacer film disposed on a side surface of the metal electrode is thicker than a portion of the spacer film disposed on a side surface of the silicon electrode.

According to one embodiment, a method is disclosed for manufacturing a semiconductor memory device. The method can include forming a plurality of stacked bodies separated from each other. A metal electrode is stacked on a silicon electrode in the plurality of stacked bodies. The method can include forming a silicon-containing film on a side surface of the stacked bodies by supplying an inorganic silicon source to the side surface of the stacked bodies. The silicon-containing film includes silicon. A portion of the silicon-containing film disposed on a side surface of the metal electrode is thicker than a portion of the silicon-containing film disposed on a side surface of the silicon electrode. The method can include oxidizing the silicon included in the silicon-containing film.

According to one embodiment, a method is disclosed for manufacturing a semiconductor memory device. The method can include forming a plurality of stacked bodies separated from each other. A metal electrode is stacked on a silicon electrode in the plurality of stacked bodies. The method can include supplying an inorganic silicon source to a side surface of the stacked bodies. The method can include depositing silicon oxide on the side surface of the stacked bodies after the supplying of the inorganic silicon source.

Embodiments of the invention will now be described with reference to the drawings.

(First Embodiment)

First, a first embodiment will be described.

Figure 1:
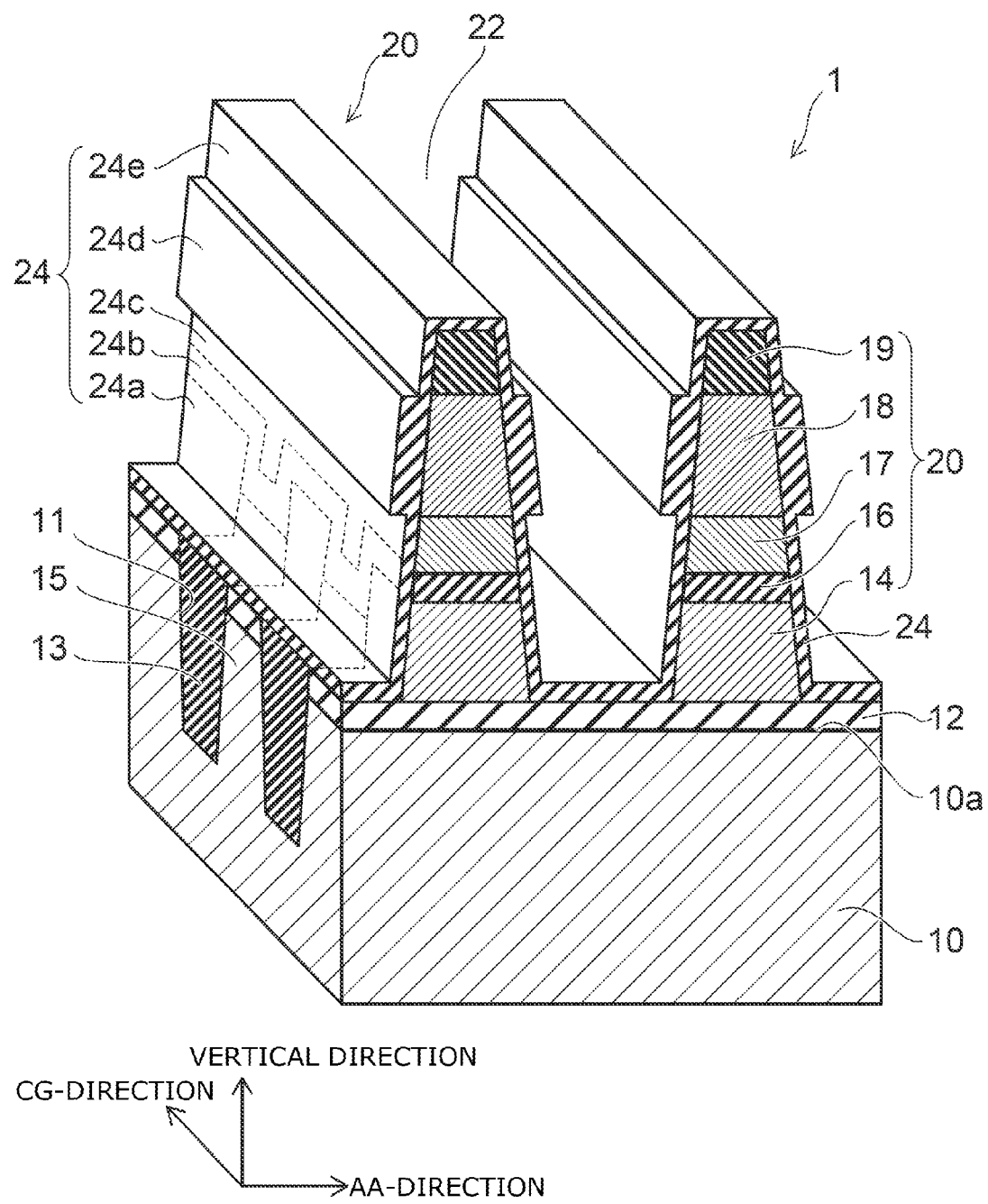
FIG. 1 is a perspective view showing a semiconductor memory device according to a first embodiment.

FIG. 1 is a perspective view showing a semiconductor memory device according to the embodiment.

Figure 2:
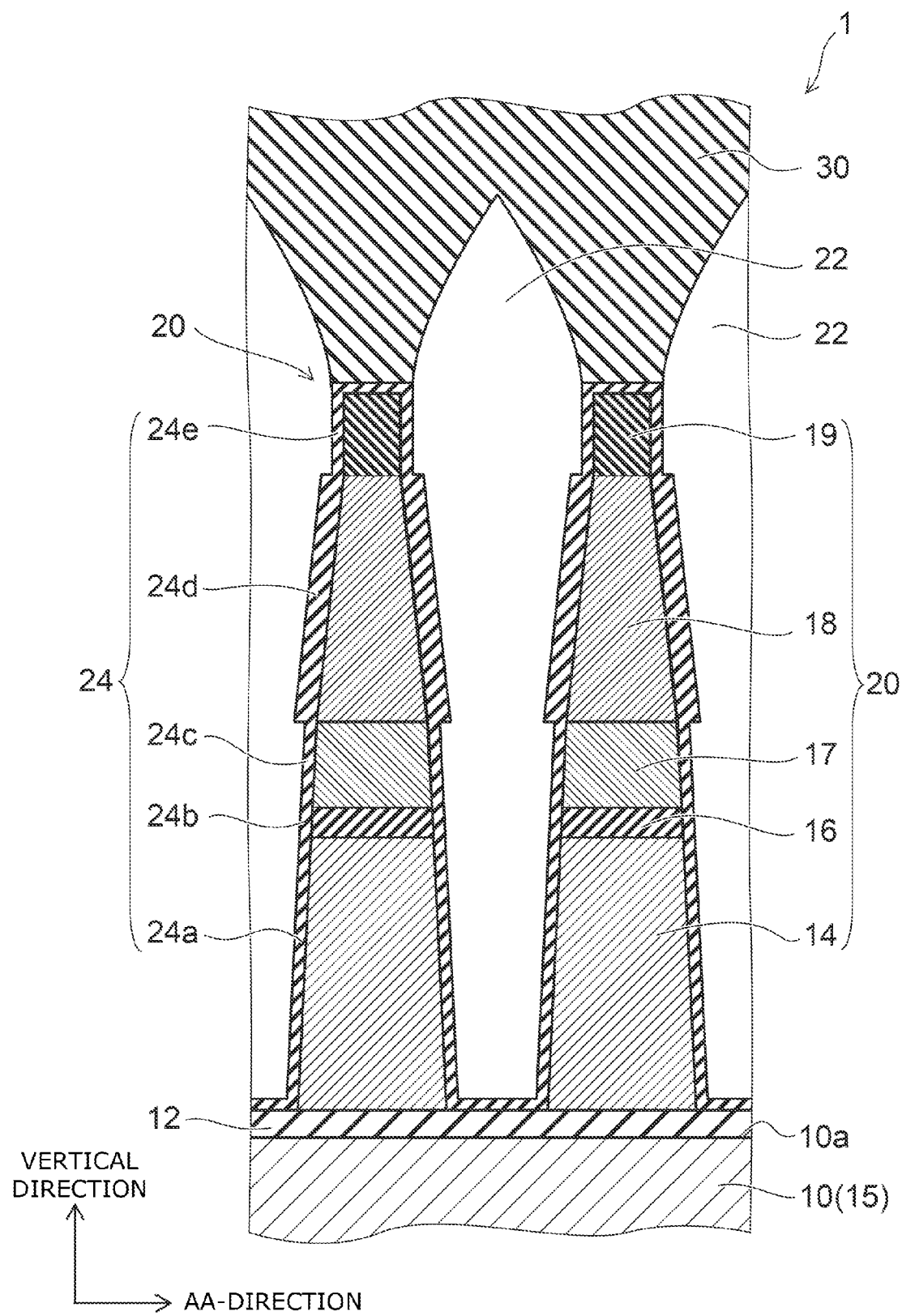
FIG. 2 is a cross-sectional view showing the semiconductor memory device according to the first embodiment.

FIG. 2 is a cross-sectional view showing the semiconductor memory device according to the embodiment.

The semiconductor memory device according to the embodiment is NAND flash memory.

As shown in FIG. 1 and FIG. 2, a silicon substrate 10 is provided in the semiconductor memory device 1 according to the embodiment. Multiple trenches 11 that extend in one direction (hereinbelow, called the "AA-direction") parallel to an upper surface 10a of the silicon substrate 10 are formed in the upper surface 10a. Also, a tunneling insulating film 12 that is made of, for example, silicon oxide is provided on the upper surface 10a of the silicon substrate 10.

Multiple gate stacked bodies 20 are arranged intermittently along the AA-direction on the tunneling insulating film 12. The gate stacked bodies 20 extend in a direction (hereinbelow, called the "CG-direction") intersecting, e.g., orthogonal to, the AA-direction. An element-separating insulator 13 and a floating gate electrode 14 are arranged alternately along the CG-direction at the lower portions of the gate stacked bodies 20.

The element-separating insulator 13 is made of silicon oxide and pierces the tunneling insulating film 12; the lower portion of the element-separating insulator 13 is filled into the trench 11; and the upper portion of the element-separating insulator 13 protrudes upward from the upper surface 10a of the silicon substrate 10. The portion of the upper portion of the silicon substrate 10 partitioned by the element-separating insulator 13 is an active area 15 extending in the AA-direction. The floating gate electrode 14 is formed of, for example, polysilicon, is divided along both the AA-direction and the CG-direction, and is arranged in a matrix configuration.

On the other hand, an IPD (Inter Poly Dielectric) film 16, a silicon electrode 17, a metal electrode 18, and a hard mask 19 are stacked in order from the lower layer side in the upper portion of the gate stacked body 20. The configurations of the IPD film 16, the silicon electrode 17, the metal electrode 18, and the hard mask 19 are line configurations extending in the CG-direction. The IPD film 16 is an insulating film including silicon oxide, e.g., an ONO (oxide-nitride-oxide) film. The silicon electrode 17 is a conductive material including silicon and is formed of, for example, polysilicon. The metal electrode 18 is a conductive material including a metal and includes, for example, at least one type of material selected from the group consisting of tungsten (W), molybdenum (Mo), titanium (Ti), tantalum (Ta), aluminum (Al), an alloy of these metals, a silicide compound of these metals, a nitride of these metals, and a carbide of these metals. The silicide compound described above may include, for example, tungsten silicide (WSi) and titanium silicide (TiSi); and the nitride described above may include, for example, tungsten nitride (WN), titanium nitride (TiN), and tantalum nitride (TaN). The hard mask 19 is an insulating material, e.g., an insulating member formed of silicon nitride.

The multiple gate stacked bodies 20 are separated from each other in the AA-direction with an air gap 22 interposed between the multiple gate stacked bodies 20. An inter-layer insulating film 30 is provided above the gate stacked bodies 20 and the air gap 22. The inter-layer insulating film 30 is formed of, for example, silicon oxide. In FIG. 1, the inter-layer insulating film 30 is not shown for convenience of illustration.

A spacer film 24 is provided on the side surfaces of the gate stacked bodies 20. The spacer film 24 is formed to have silicon oxide as a major component. The spacer film 24 covers the side surfaces of the element-separating insulator 13, the floating gate electrode 14, the IPD film 16, the silicon electrode 17, the metal electrode 18, and the hard mask 19.

Also, a portion 24d of the spacer film 24 disposed on the side surface of the metal electrode 18 is thicker than a portion 24a of the spacer film 24 provided on the side surface of the floating gate electrode 14, a portion 24b of the spacer film 24 provided on the side surface of the IPD film 16, and a portion 24c of the spacer film 24 provided on the side surface of the silicon electrode 17.

A method for manufacturing the semiconductor memory device according to the embodiment will now be described.

FIG. 3A to FIG. 3C are cross-sectional views of processes, showing the method for manufacturing the semiconductor memory device according to the embodiment.

First, as shown in FIG. 1, the silicon substrate 10 is prepared. Then, the tunneling insulating film 12 is formed on the entire surface of the silicon substrate 10; and the floating gate electrode 14 is formed by, for example, depositing silicon on the tunneling insulating film 12. Then, a hard mask (not shown) that is made of, for example, silicon nitride is formed; and the hard mask is formed in a line-and-space configuration extending in the AA-direction.

Then, by performing anisotropic etching such as RIE (Reactive Ion Etching), etc., using the hard mask as a mask, the floating gate electrode 14 and the tunneling insulating film are selectively removed to pattern the floating gate electrode 14 and the tunneling insulating film 12 into a line-and-space configuration extending in the AA-direction, and the trench 11 is made by selectively removing the upper portion of the silicon substrate 10.

Then, the element-separating insulator 13 is formed inside the trench 11, between the tunneling insulating films 12, and between the floating gate electrodes 14 by depositing silicon oxide on the entire surface and performing etch-back. At this time, the portion of the silicon substrate 10 partitioned by the element-separating insulator 13 becomes the active area 15. Subsequently, the hard mask is removed.

Then, the IPD film 16, the silicon electrode 17, and the metal electrode 18 are formed in this order on the entire surface of the element-separating insulator 13 and the floating gate electrode 14. The metal electrode 18 is formed to have, for example, tungsten as a major component.

Then, as shown in FIG. 2, the hard mask 19 is formed in a line-and-space configuration extending in the CG-direction. Then, by performing anisotropic etching such as RIE, etc., using the hard mask 19 as a mask, the multiple gate stacked bodies 20 are formed in line configurations extending in the CG-direction by selectively removing the metal electrode 18, the silicon electrode 17, the IPD film 16, the floating gate electrode 14, and the upper portion of the element-separating insulator 13. Thus, the multiple gate stacked bodies 20 in which the metal electrode 18 is stacked on the silicon electrode 17 are formed to be separated from each other.

As shown in FIG. 2 and FIG. 3A, at this stage, the side surface of the upper portion of the element-separating insulator 13, the side surface of the floating gate electrode 14, the side surface of the IPD film 16, the side surface of the silicon electrode 17, and the side surface of the metal electrode 18 are exposed at side surfaces 20a of the gate stacked bodies 20.

Then, a silicon-containing film 34 that includes silicon is formed on the side surfaces 20a of the gate stacked bodies 20 by CVD (Chemical Vapor Deposition) using an inorganic silicon source. Specifically, at least one type of source-material gas selected from the group consisting of, for example, monosilane ($SiH_4$), disilane ($Si_2H_6$), dichlorosilane ($SiH_2Cl_2$), and hexachlorodisilane ($Si_2Cl_6$) is caused to flow into a chamber as the inorganic silicon source while heating the gate stacked bodies 20 in the interior of the chamber to a prescribed temperature. More specifically, the temperature of the gate stacked bodies 20 is set to 450 to 600° C. and monosilane is supplied; the temperature is set to 300 to 450° C. and disilane is supplied; the temperature is set to 550 to 750° C. and dichlorosilane is supplied; or the temperature is set to 450 to 650° C. and hexachlorodisilane is supplied.

Thereby, as shown in FIG. 3B, the silicon-containing film 34 that is made of mainly amorphous silicon is formed. At this time, for the silicon-containing film 34, a portion 34d formed on the side surface of the metal electrode 18 is relatively thick; and a portion 34a formed on the side surface of the floating gate electrode 14, a portion 34b formed on the side surface of the IPD film 16, a portion 34c formed on the side surface of the silicon electrode 17, and a portion 34e formed on the side surface of the hard mask 19 are relatively thin. In other words, for the silicon-containing film 34, the portion 34d is thicker than the other portions. An experimental example having this phenomenon is described below.

Then, as shown in FIG. 3C, oxidation treatment of the silicon-containing film 34 is performed by, for example, performing heat treatment inside an oxidation atmosphere. Also, the oxidation treatment is performed at conditions such that the silicon included in the silicon-containing film 34 is selectively oxidized more than the metal, e.g., tungsten or molybdenum, included in the metal electrode 18. Thereby, the silicon inside the silicon-containing film 34 is oxidized to become the spacer film 24. Because the film thickness of the spacer film 24 reflects the film thickness of the silicon-containing film 34 as-is, the portion 24d disposed on the side surface of the metal electrode 18 is thicker than the other portions.

Then, ion implantation is performed to form a diffusion layer (not shown) of the memory cell. Then, heat treatment is performed to activate the implanted impurity. Then, as shown in FIG. 2, silicon oxide is deposited at conditions such that the coverage is poor. Thereby, the inter-layer insulating film 30 is formed on the entire surface to seal the upper portion of the air gap 22 while leaving the air gap 22 between the gate stacked bodies 20. Then, planarization of the upper surface of the inter-layer insulating film 30 is performed. Then, upper layer interconnects, etc., are formed on the inter-layer insulating film 30. Thus, the semiconductor memory device 1 is manufactured.

Effects of the embodiment will now be described.

In the semiconductor memory device 1 according to the embodiment as shown in FIG. 1 and FIG. 2, the portion 24d of the spacer film 24 disposed on the side surface of the metal electrode 18 is thicker than the other portions of the spacer film 24. Therefore, even in the case where heat treatment is performed to activate the impurity, etc., after the spacer film 24 is formed, the metal atoms that are included in the metal electrode 18 are prevented from diffusing through the spacer film 24, reaching the surface on the air gap 22 side, and contaminating the interior of the air gap 22. Thereby, the reliability of the semiconductor memory device 1 can be guaranteed.

Conversely, if the film thickness of the portion 24d is insufficient, the metal atoms that are included in the metal electrode 18 diffuse in the film thickness direction through the spacer film 24 due to the heat treatment and undesirably reach the air gap 22. The metal atoms that reach the interior of the air gap 22 undesirably cause fluctuation of the characteristics of the memory cell by acting as charge trapping sites at the memory cell edge. As a result, the reliability of the semiconductor memory device 1 decreases.

Also, in the embodiment, the portions of the spacer film 24 other than the portion 24d are thinner than the portion 24d. Thereby, the width of the air gap 22 can be ensured to be wide; and the parasitic capacitance between the memory cells can be reduced.

Thus, according to the embodiment, both the prevention of the metal contamination by suppressing the diffusion of the metal by setting the portion 24d of the spacer film 24 to be thick and the reduction of the parasitic capacitance between the memory cells by widening the width of the air gap 22 by reducing the thicknesses of the portions of the spacer film 24 other than the portion 24d can be realized. As a result, even higher integration of the semiconductor memory device 1 can be realized.

(Second Embodiment)

A second embodiment will now be described.

FIG. 4A to FIG. 4C are cross-sectional views of processes, showing a method for manufacturing a semiconductor memory device according to the embodiment.

First, as shown in FIG. 1 and FIG. 2, the gate stacked bodies 20 are formed by a method similar to that of the first embodiment described above. As shown in FIG. 4A, at this stage, the side surface of the upper portion of the element-separating insulator 13, the side surface of the floating gate electrode 14, the side surface of the IPD film 16, the side surface of the silicon electrode 17, the side surface of the metal electrode 18, and the side surface of the hard mask 19 are exposed at the side surfaces 20a of the gate stacked bodies 20.

Then, as shown in FIG. 4B, a silicon-containing film 44 that includes silicon is formed on the side surfaces 20a of the gate stacked bodies 20 by CVD using an inorganic silicon source. However, compared to the first embodiment described above, the flow time of the inorganic silicon source is shorter. Thereby, for the side surfaces 20a of the gate stacked bodies 20, the silicon is deposited preferentially on the side surface of the metal electrode 18. As a result, the silicon-containing film 44 is formed selectively on the side surface of the metal electrode 18 and substantially is not formed on the side surface of the floating gate electrode 14, on the side surface of the IPD film 16, on the side surface of the silicon electrode 17, and on the side surface of the hard mask 19. A major component of the silicon-containing film 44 is, for example, amorphous silicon.

Specifically, the formation of the silicon-containing film 44 is performed by, for example, causing at least one type of source-material gas selected from the group consisting of monosilane ($SiH_4$), disilane ($Si_2H_6$), dichlorosilane ($SiH_2Cl_2$), and hexachlorodisilane ($Si_2Cl_6$) to flow into a chamber as the inorganic silicon source while heating the gate stacked bodies 20 in the interior of the chamber to a prescribed temperature. More specifically, the temperature of the gate stacked bodies 20 is set to 450 to 600° C. and monosilane is supplied; the temperature is set to 300 to 450° C. and disilane is supplied; the temperature is set to 550 to 750° C. and dichlorosilane is supplied; or the temperature is set to 450 to 650° C. and hexachlorodisilane is supplied.

Then, as shown in FIG. 4C, silicon oxide is deposited on the side surfaces 20a of the gate stacked bodies 20. For example, silicon oxide is deposited by ALD (atomic layer deposition) using ozone ($O_3$) and an organic silicon source, e.g., an aminosilane-based organic silicon source, as the source-material gas. Thereby, the spacer film 24 is formed on the side surface 20a. Here, if the spacer film 24 is formed by ALD using the aminosilane-based organic silicon source gas directly in the state in which the side surface of the metal electrode 18 is exposed without performing the supply of the inorganic silicon source gas described above, the adsorption efficiency of the aminosilane-based source at the surface of the metal is poor; and the silicon oxide film that is formed on the surface of the metal is thinner than on the other side surfaces of the floating gate electrode 14, the IPD film 16, the silicon electrode 17, and the hard mask 19. Conversely, according to the manufacturing method described above, by using the inorganic silicon source to selectively preform the liner film (the silicon-containing film 44) having silicon as the major component on only the side surface of the metal electrode 18, the foundation dependence of the silicon source adsorption amount in the ALD film formation is eliminated; and the silicon oxide film can be deposited conformally on the side surfaces of the gate stacked bodies 20. As a result, for the spacer film 24, the portion 24d that is formed on the side surface of the metal electrode 18 is thicker than the other portions by the amount that the silicon-containing film 44 is assimilated.

Further, inside the portion 24d of the spacer film 24, a portion 24s on the metal electrode 18 side is formed by oxidizing the silicon-containing film 44 that has amorphous silicon as a major component; and therefore, there are less impurities such as carbon (C), nitrogen (N), etc., originating from the aminosilane-based organic silicon source in the portion 24s. Accordingly, in the portion 24d, the carbon concentration of the portion 24s on the metal electrode 18 side is lower than the carbon concentration of a portion 24t on the air gap 22 side. Also, the nitrogen concentration of the portion 24s is lower than the nitrogen concentration of the portion 24t. Further, the film density of the portion 24s is higher than the film density of the portion 24t. Thus, the impurities are less and the film structure is denser for the portion 24s on the metal electrode 18 side than for the portion 24t on the air gap 22 side. Therefore, in the case where wet etching of the spacer film 24 is performed using dilute hydrofluoric acid, etc., as the etchant, the etching rate of the portion 24s is lower than the etching rate of the portion 24t. However, there are many cases where a distinct boundary is not confirmed between the portion 24s and the portion 24t.

According to the embodiment, in addition to the effects of the first embodiment described above, the scattering (the self-contamination) of the metal due to the metal electrode 18 being exposed to the aminosilane precursor when the spacer film 24 is formed by ALD also can be prevented because the side surface of the metal electrode 18 is covered with the silicon-containing film 44.

Otherwise, the configuration, the manufacturing method, and the effects of the embodiment are similar to those of the first embodiment described above.

For the gate stacked bodies 20 in the first and second embodiments described above, hydrogen gas may be caused to flow prior to causing the inorganic silicon source to flow. Thereby, reduction of the side surface of the metal electrode 18 can be performed by exposing the side surface to a hydrogen atmosphere. As a result, the silicon-containing film can be formed more reliably on the side surface of the metal electrode 18.

TEST EXAMPLE 1

Figure 5:
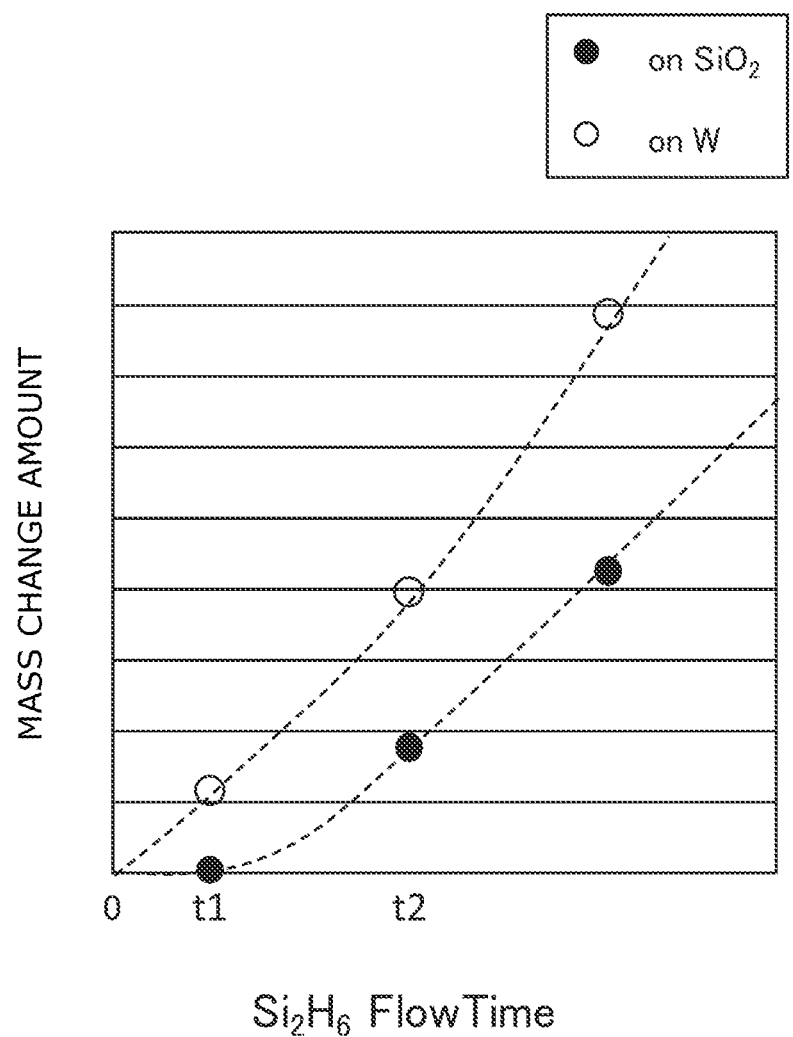
FIG. 5 is a graph showing the substrate dependence of the silicon deposition amount of a test example 1, where the horizontal axis is the flow time of disilane and the vertical axis is the mass change amount of the sample.

FIG. 5 is a graph showing the substrate dependence of the silicon deposition amount of a test example 1, where the horizontal axis is the flow time of disilane and the vertical axis is the mass change amount of the sample.

In the test example, a silicon oxide substrate and a tungsten substrate were placed in a chamber; and disilane ($Si_2H_6$) was caused to flow into the chamber at a constant flow rate in a state of being heated to a prescribed temperature. Then, at each constant flow interval, the substrates were extracted and the mass was measured.

As shown in FIG. 5, on the tungsten substrate, the formation of the silicon-containing film started immediately after the supply of the disilane was started. On the other hand, on the silicon oxide substrate, the formation of the silicon-containing film started after a constant amount of time had elapsed after the supply of the disilane. By utilizing the difference due to the incubation time, for example, if the supply of the disilane is stopped at time t1, the silicon-containing film 44 can be formed only on the side surface of the metal electrode 18 as in the second embodiment described above. Also, if the supply of the disilane is stopped at time t2, as in the first embodiment described above, the silicon-containing film 34 can be formed such that the portion 34d that is formed on the side surface of the metal electrode 18 is relatively thick and the other portions, in particular, the portion 34b formed on the side surface of the IPD film 16, are relatively thin.

TEST EXAMPLE 2

Figure 6:
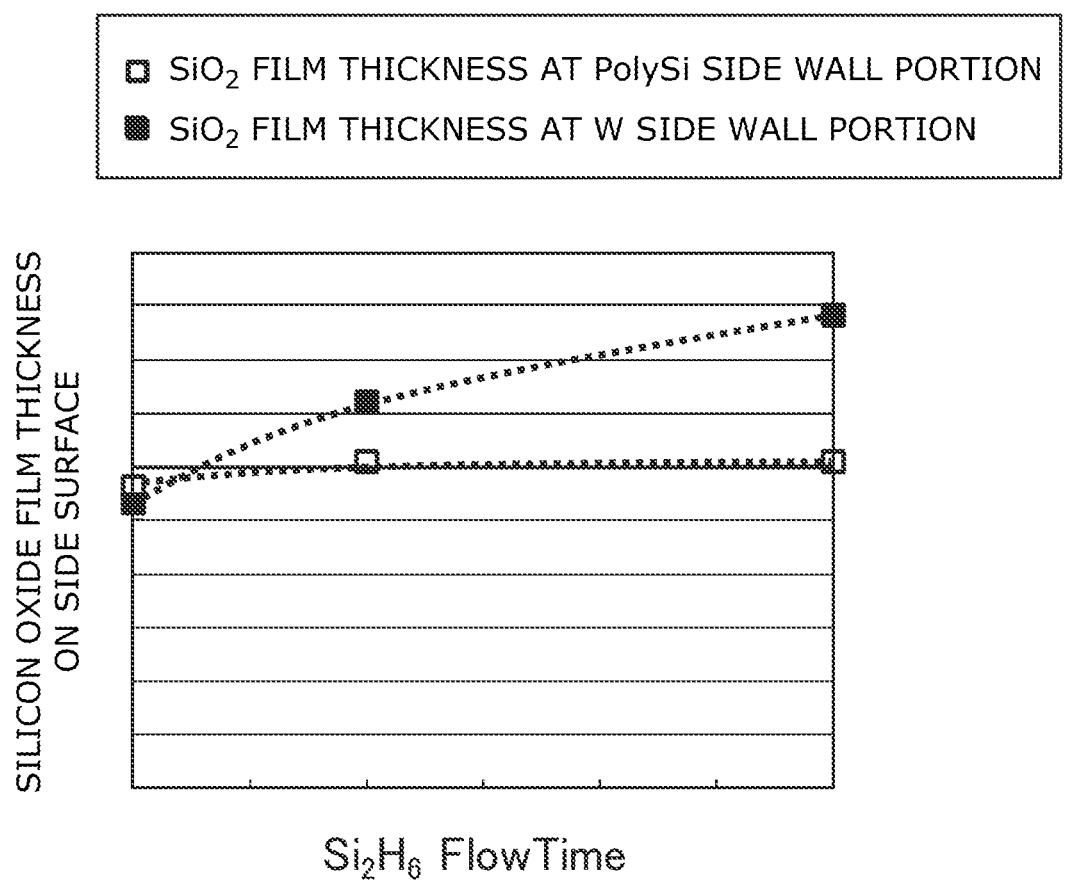
FIG. 6 shows the silicon oxide film thicknesses at poly silicon side wall portion and tungsten side wall portion of a test example 2, where the horizontal axis is the flow time of disilane, and the vertical axis is the film thickness of the silicon oxide film.

FIG. 6 shows the silicon oxide film thicknesses at poly silicon side wall portion and tungsten side wall portion of a test example 2, where the horizontal axis is the flow time of disilane, and the vertical axis is the film thickness of the silicon oxide film.

FIG. 7A and FIG. 7B are cross-sectional views showing the gate stacked bodies of the test example 2 after the spacer film is formed.

In the test example, the gate stacked bodies 20 were formed and placed into a chamber; disilane was caused to flow into the chamber for a prescribed amount of time; silicon oxide was deposited; the thickness of the silicon oxide film on the side surface of the floating gate electrode (FG) 14 made of polysilicon was measured; and the thickness of the silicon oxide film on the side surface of the metal electrode 18 made of tungsten (W) was measured. Also, microscopy using TEM (Transmission Electron Microscopy) was performed. FIG. 7A and FIG. 7B schematically show the cross section TEM photographs. Further, FIG. 6 shows the results of measuring the film thickness of the silicon oxide film in such cross section TEM photographs.

As shown in FIG. 6 and FIG. 7A, when disilane was not caused to flow, the thickness of the silicon oxide film formed as the spacer film was thinner on the side surface of the metal electrode than on the side surface of the floating gate electrode. However, as shown in FIG. 6 and FIG. 7B, when disilane was caused to flow prior to forming the silicon oxide film as the spacer film, the portion of the silicon oxide film on the side surface of the metal electrode became thicker than the portion on the side surface of the floating gate electrode. In the second embodiment described above, the portion 24d of the spacer film 24 can be formed to be thicker than the other portions by utilizing this phenomenon.

TEST EXAMPLE 3

Figure 8:
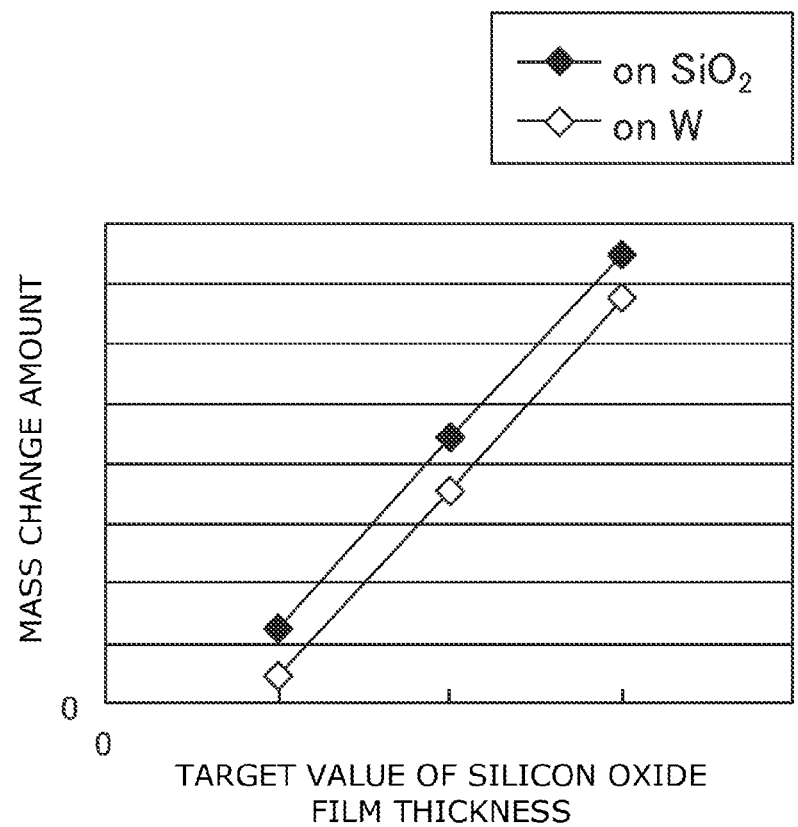
FIG. 8 is a graph showing the substrate dependence of the deposition amount of silicon oxide of a test example 3, where the horizontal axis is the target value of the film thickness of the silicon oxide film, and the vertical axis is the mass change amount of the sample.

FIG. 8 is a graph showing the substrate dependence of the deposition amount of silicon oxide of a test example 3, where the horizontal axis is the target value of the film thickness of the silicon oxide film, and the vertical axis is the mass change amount of the sample.

Figure 9:
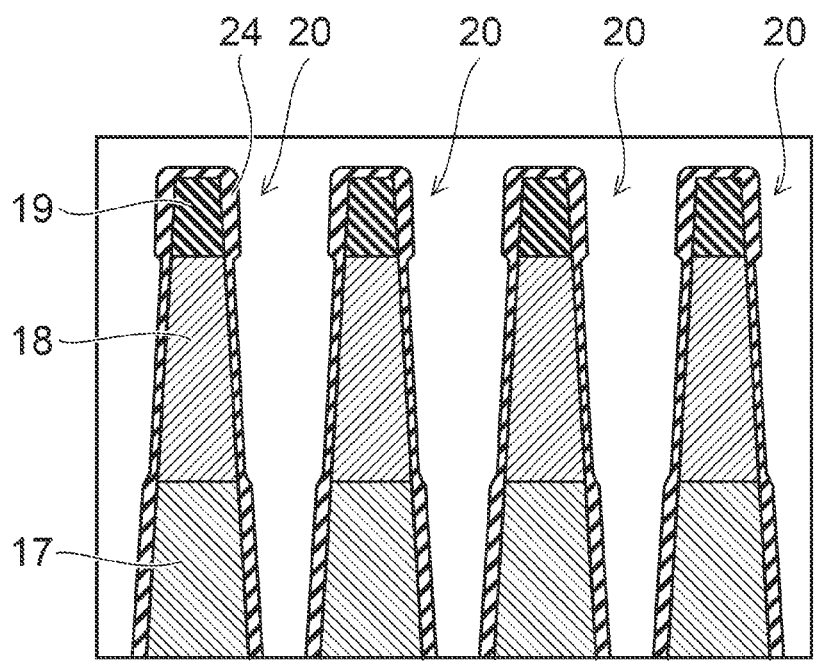
FIG. 9 is a cross-sectional view showing the gate stacked bodies of a test example 3 after the spacer film is formed.

FIG. 9 is a cross-sectional view showing the gate stacked bodies of the test example 3 after the spacer film is formed.

In the test example, using a tungsten substrate and a silicon oxide substrate, silicon oxide was deposited by ALD using an aminosilane-based silicon source gas as the source material without causing disilane to flow; and the mass change amount was measured before and after the deposition. Also, the gate stacked bodies 20 were formed; silicon oxide was deposited as the spacer film 24 on the side surfaces of the gate stacked bodies 20 by ALD using an aminosilane-based silicon source gas as the source material; and microscopy of the cross section was performed by TEM. FIG. 9 schematically shows the cross section TEM photograph.

As shown in FIG. 8 and FIG. 9, for the silicon oxide film formed by ALD using the aminosilane-based silicon source gas as the source material without supplying disilane beforehand, the portion formed on the side surface of the metal electrode 18 made of tungsten was thinner than the other portions. In particular, this portion was thinner than the portion formed on the side surface of the IPD film 16 made of silicon oxide. Therefore, if silicon oxide is formed using an organic silicon source such as aminosilane, etc., without pre-supplying an inorganic silicon source such as disilane, etc., the portion 24d of the spacer film 24 formed on the side surface of the metal electrode 18 undesirably becomes thinner than the other portions.

(Third Embodiment)

A third embodiment will now be described.

Figure 10A:
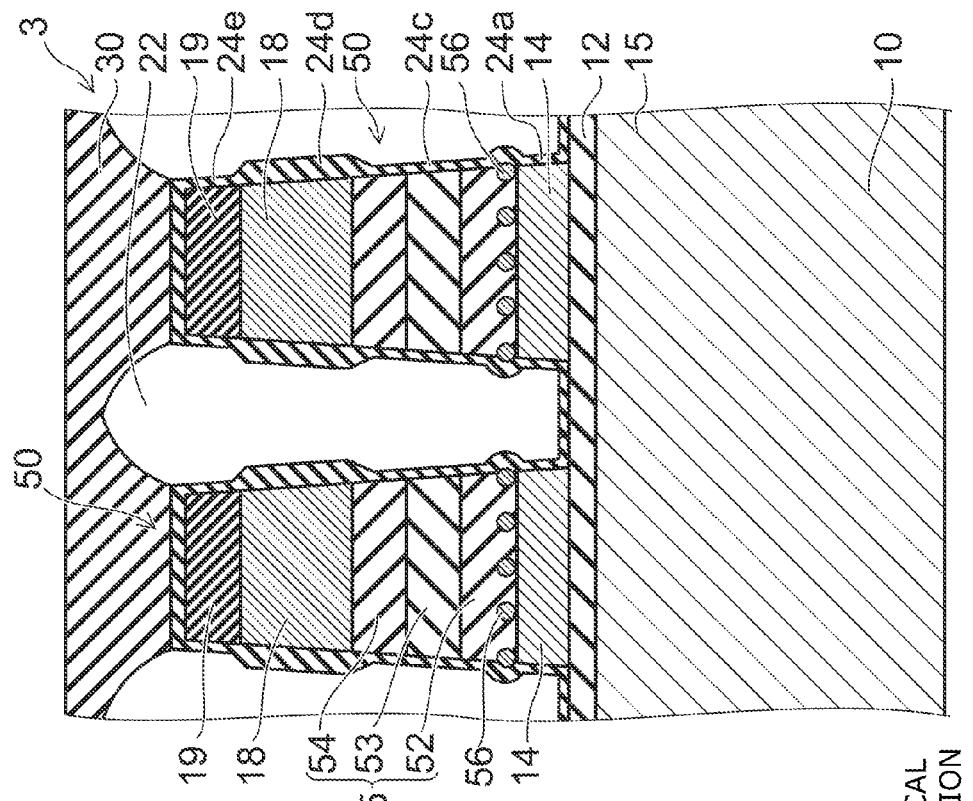
FIG. 10A and FIG. 10B are cross-sectional views showing the semiconductor memory device according to a third embodiment.
Figure 10B:
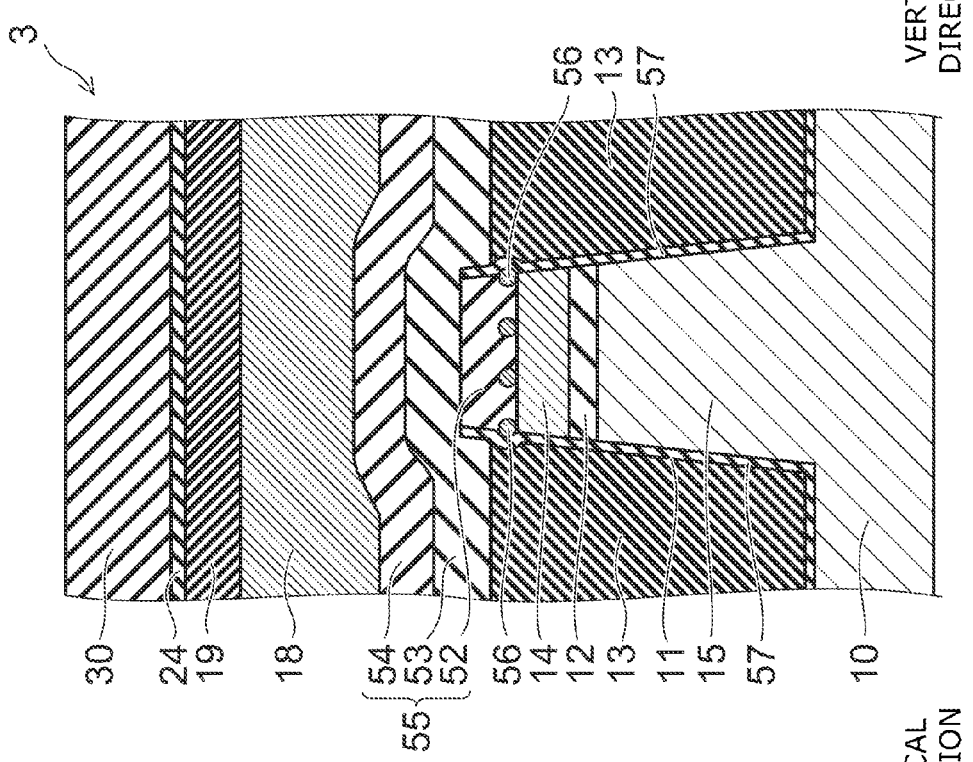

FIG. 10A and FIG. 10B are cross-sectional views showing a semiconductor memory device according to the embodiment.

As shown in FIG. 10A and FIG. 10B, the configurations of gate stacked bodies 50 in the semiconductor memory device 3 according to the embodiment are different from that of the semiconductor memory device 1 (referring to FIG. 1) according to the first embodiment described above. In the gate stacked bodies 50 of the embodiment, the floating gate electrode 14, a hafnium oxide film 52, a silicon oxide film 53, a hafnium oxide film 54, the metal electrode 18, and the hard mask 19 are stacked from the lower layer side toward the upper layer side. A blocking insulating film 55 includes the hafnium oxide film 52, the silicon oxide film 53, and the hafnium oxide film 54.

However, the material and film configuration of the blocking insulating film 55 are not limited thereto. For example, the blocking insulating film 55 may be formed of a metal oxide generally called a High-k material, e.g., titanium oxide ($TiO_2$), zirconium oxide ($ZrO_2$), and alumina ($Al_2O_3$) as well as the silicon oxide ($SiO_2$) and hafnium oxide ($HfO_2$) described above, may be formed of a compound of these metal oxides, may be formed of silicon nitride ($Si_3N_4$) and silicon oxynitride (SiON), or may be a stacked film of layers made of these materials.

Then, many metal nanodots 56 are provided at the interface between the floating gate electrode 14 and the hafnium oxide film 52. The metal nanodots 56 are fine particles formed of a metal, e.g., ruthenium (Ru).

Similarly to the first embodiment described above, the floating gate electrode 14 is formed of, for example, polysilicon, is divided along both the AA-direction and the CG-direction, and is arranged in a matrix configuration. Similarly to the floating gate electrode 14, the hafnium oxide film 52 also is divided and is arranged in a matrix configuration. A spacer film 57 is provided on CG-direction facing side surfaces of the stacked bodies made of the active area 15, the tunneling insulating film 12, the floating gate electrode 14, and the hafnium oxide film 52; and the element-separating insulator 13 is provided between the stacked bodies in the CG-direction.

Conversely, the silicon oxide film 53, the hafnium oxide film 54, the metal electrode 18, and the hard mask 19 are provided in a line configuration extending in the CG-direction on the hafnium oxide film 52 and the element-separating insulator 13. Similarly to the first embodiment described above, the metal electrode 18 is formed of conductive materials including metals and is a two-layer film in which, for example, a tungsten layer (a W layer) and a tungsten nitride layer (a WN layer) are stacked in this order. A polysilicon electrode may be provided between the blocking insulating film 55 and the metal electrode 18. The hard mask 19 is formed of an insulating material, e.g., silicon nitride.

Similarly to the first embodiment described above, the spacer film 24 is provided on the AA-direction side surfaces of the gate stacked bodies 50. For the spacer film 24, the portion 24d disposed on the side surface of the metal electrode 18 is thicker than the portion 24a provided on the side surface of the floating gate electrode 14, the portion 24c provided on the side surface of the blocking insulating film 55, and a portion 24e provided on the side surface of the hard mask 19. Otherwise, the configuration of the embodiment is similar to that of the first embodiment described above.

A method for manufacturing the semiconductor memory device according to the embodiment will now be described.

Figure 11A:
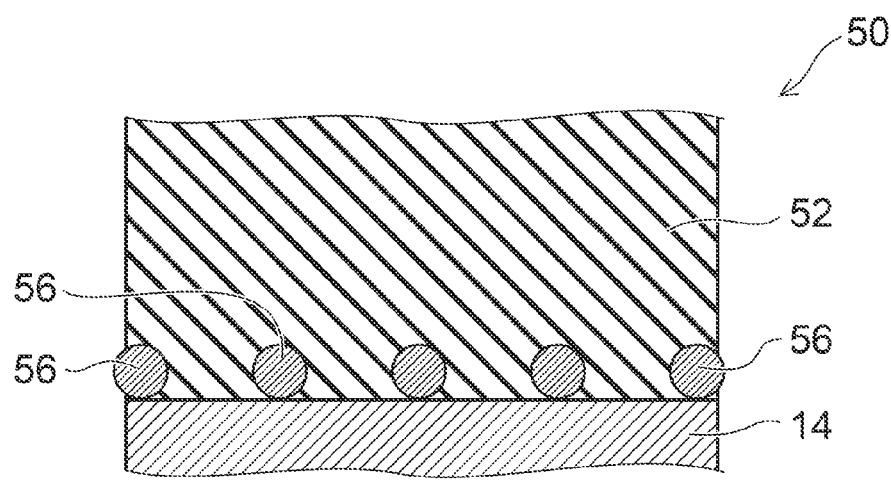
FIG. 11A to FIG. 11C are cross-sectional views of processes, showing the method for manufacturing the semiconductor memory device according to the third embodiment.
Figure 11B:
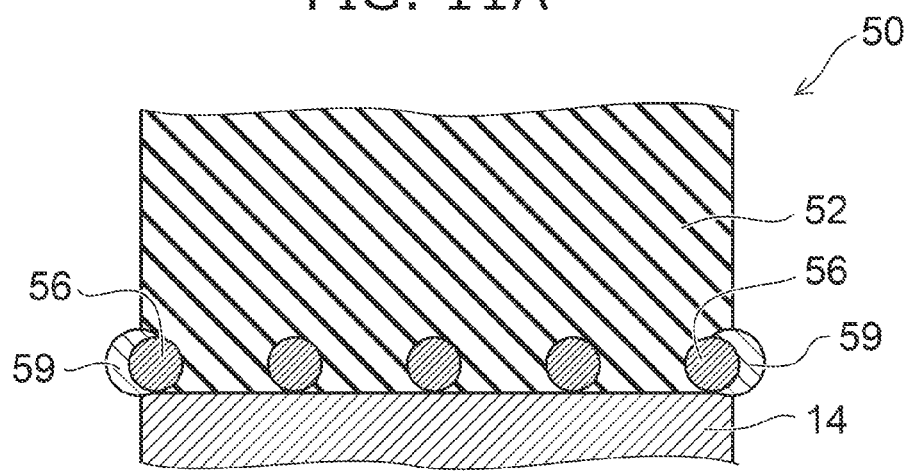
Figure 11C:
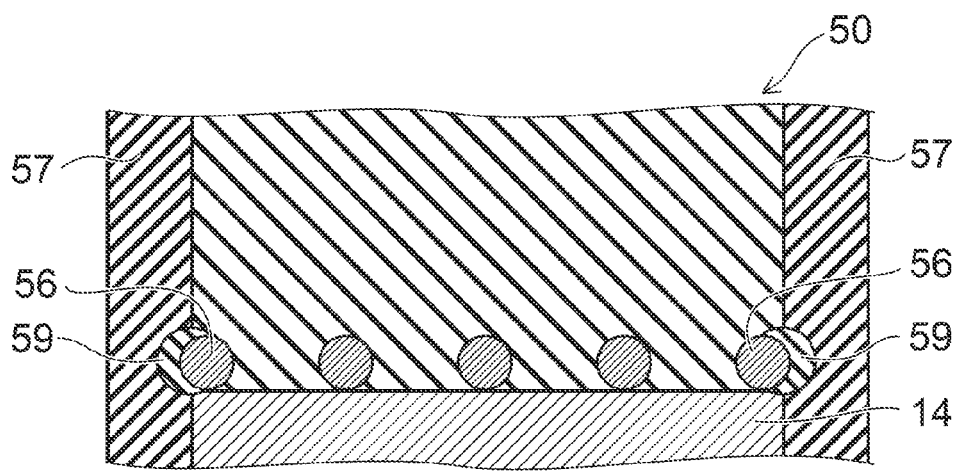

FIG. 11A to FIG. 11C are cross-sectional views of processes, showing the method for manufacturing the semiconductor memory device according to the embodiment.

First, as shown in FIG. 10A and FIG. 10B, the tunneling insulating film 12 and the floating gate electrode 14 are formed on the silicon substrate 10; and the metal nanodots 56 that are made of ruthenium (Ru) are formed on the tunneling insulating film 12 and the floating gate electrode 14. Then, the hafnium oxide film 52 is formed.

Then, the hafnium oxide film 52, the floating gate electrode 14, the tunneling insulating film 12, and the upper portion of the silicon substrate 10 are selectively removed to pattern the hafnium oxide film 52, the floating gate electrode 14, and the tunneling insulating film 12 into a line-and-space configuration extending in the AA-direction and make the trench 11 in the upper portion of the silicon substrate 10. At this time, as shown in FIG. 11A, some of the metal nanodots 56 are exposed at the patterned surface of the hafnium oxide film 52.

Then, as shown in FIG. 11B, CVD using an inorganic silicon source is performed. For example, disilane ($Si_2H_6$) is used as the inorganic silicon source. A silicon-containing film 59 is formed on the surfaces of the metal nanodots 56 exposed from the hafnium oxide film 52 by appropriately selecting the supply time of the disilane. A major component of the silicon-containing film 59 is, for example, amorphous silicon.

Then, as shown in FIG. 11C, the spacer film 57 is formed on the side surface of the trench 11 and the side surfaces of the stacked bodies made of the tunneling insulating film 12, the floating gate electrode 14, and the hafnium oxide film 52 by continuously performing ALD using, for example, organic silicon source and ozone. At this time, the silicon-containing film 59 is assimilated into the spacer film 57.

Then, as shown in FIG. 10A and FIG. 10B, the element-separating insulator 13 is formed by depositing silicon oxide; and CMP is performed using the hafnium oxide film 52 as a stopper. Then, etch-back of the upper surface of the element-separating insulator 13 is performed to cause the upper surface of the element-separating insulator 13 to be positioned lower than the upper surface of the hafnium oxide film 52 and higher than the lower surface of the hafnium oxide film 52.

Then, the silicon oxide film 53, the hafnium oxide film 54, and the metal electrode 18 are formed on the hafnium oxide film 52 and the element-separating insulator 13. Then, the hard mask 19 is formed in a line-and-space configuration extending in the CG-direction on the metal electrode 18; and etching such as RIE, etc., is performed using the hard mask 19 as a mask. Thereby, the gate stacked bodies 50 are formed by selectively removing the metal electrode 18, the hafnium oxide film 54, the silicon oxide film 53, the hafnium oxide film 52, and the floating gate electrode 14. At this time, the metal nanodots 56 are exposed at the patterned surface of the hafnium oxide film 52.

Then, similarly to when the silicon-containing film 59 described above is formed, a silicon-containing film is formed on the side surfaces of the gate stacked bodies 50 by CVD using an inorganic silicon source such as disilane ($Si_2H_6$), etc. Thereby, the silicon-containing film is formed on the surfaces of the metal nanodots 56 exposed from the hafnium oxide film 52; and the silicon-containing film 44 (referring to FIG. 4B) is formed on the side surface of the metal electrode 18.

Then, the spacer film 24 that is made of silicon oxide is formed on the side surfaces of the gate stacked bodies 50 by ALD using, for example, organic silicon source and ozone. At this time, the silicon-containing film is assimilated into the spacer film 24. Further, the portion 24d of the spacer film 24 is thicker than the other portions.

Then, similarly to the first embodiment described above, silicon oxide is deposited at conditions such that the coverage is poor. Thereby, the air gap 22 is made between the gate stacked bodies 50 while forming the inter-layer insulating film 30 on the gate stacked bodies 50 as a continuous film. Thus, the semiconductor memory device 3 is manufactured. Otherwise, the manufacturing method of the embodiment is similar to that of the second embodiment described above.

Effects of the embodiment will now be described.

In the semiconductor memory device 3 according to the embodiment as shown in FIG. 10A and FIG. 10B, the metal nanodots 56 that are made of ruthenium are provided on the interface between the floating gate electrode 14 and the hafnium oxide film 52. The memory cell is realized by the metal nanodots 56 being used as a charge storage member.

However, some of the metal nanodots 56 are exposed at the patterned surface of the hafnium oxide film 52 in the dividing process along the AA-direction shown in FIG. 11A and the subsequent dividing process along the CG-direction. Therefore, if the silicon oxide is deposited as-is, the metal nanodots 56 that are made of ruthenium will be exposed to ozone at a temperature of about 300° C. Thereby, the exposed metal nanodots 56 are consumed due to the ruthenium oxidizing and sublimating; and the characteristics of the memory cell degrade. Also, the sublimated ruthenium oxide contaminates the chamber of the film formation apparatus. In particular, as the downscaling of the memory cell progresses, this problem is serious because the proportion of all of the metal nanodots 56 exposed at the patterned surface of the hafnium oxide film 52 increases.

Therefore, in the embodiment, the silicon-containing film 59 is formed on the exposed surfaces of the metal nanodots 56 by performing CVD using the inorganic silicon source in the process shown in FIG. 11B. Thereby, when forming the spacer film 57 in the process shown in FIG. 11C, the oxidization of the metal nanodots 56 can be suppressed. As a result, the consumption of the metal nanodots 56 can be suppressed; and the characteristics of the memory cell can be maintained. Also, the material of the sublimated metal nanodots 56 can be prevented from contaminating the chamber of the film formation apparatus. This is similar when forming the spacer film 24 as well.

Figure 12:
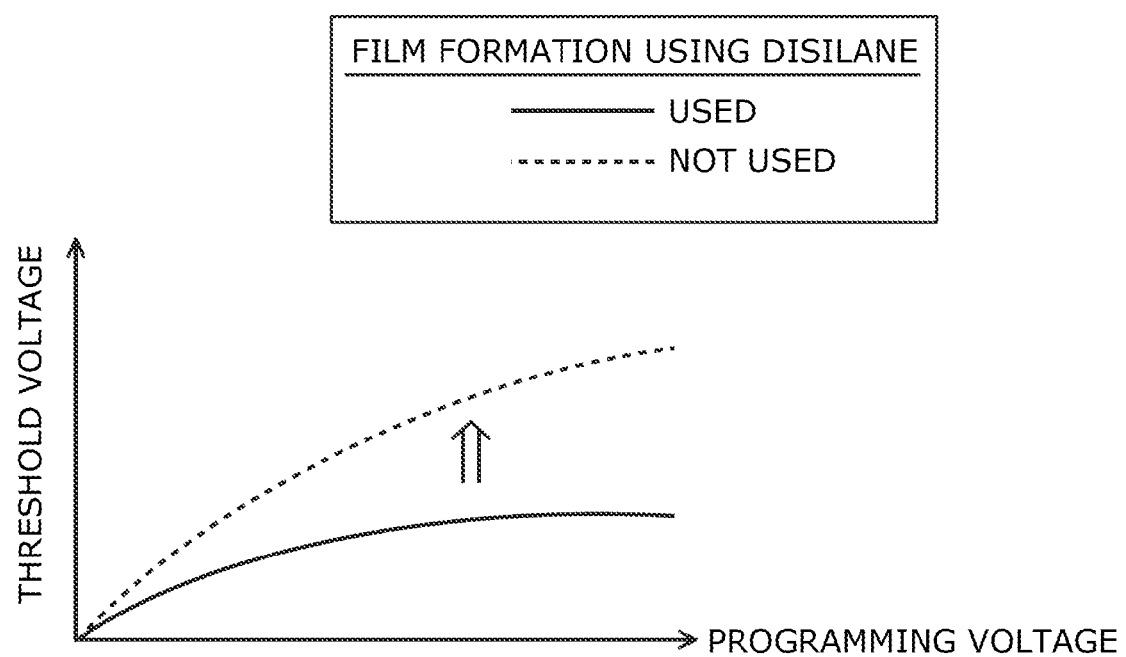
FIG. 12 is a graph showing effects of the film formation using disilane, where the horizontal axis is the programming voltage, and the vertical axis is the threshold voltage of the memory cell.

FIG. 12 is a graph showing effects of the film formation using disilane, where the horizontal axis is the programming voltage, and the vertical axis is the threshold voltage of the memory cell.

As shown in FIG. 12, the fluctuation amount of the threshold for the same applied programming voltage is greater and the operation window of the memory cell is wider for the case where the film formation using disilane is performed prior to the formation of the spacer film than for the case where the film formation using disilane is not performed. It is considered that this is because, by performing the film formation using disilane, the silicon-containing film 59 is formed to cover the metal nanodots 56 exposed at the patterned surface of the hafnium oxide film 52; the metal nanodots 56 consumption is prevented; and therefore more of the metal nanodots 56 remain to function as the charge storage member.

Thus, according to the embodiment, a semiconductor memory device having a wide read-out window of the memory cell can be stably manufactured. Otherwise, the effects of the embodiment are similar to those of the first embodiment described above.

According to the embodiments described above, a semiconductor memory device and a method for manufacturing the semiconductor memory device that realize both high reliability and high inter-memory cell capacitance even for higher integration can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor memory device, comprising:
    forming a plurality of stacked bodies separated from each other, a metal electrode being stacked on a silicon electrode in the plurality of stacked bodies;
    supplying a silicon source to a side surface of the stacked bodies, the silicon source being inorganic; and
    depositing silicon oxide on the side surface of the stacked bodies after the supplying of the inorganic silicon source.

2. The method for manufacturing the semiconductor memory device according to claim 1, wherein monosilane is used as the inorganic silicon source.

3. The method for manufacturing the semiconductor memory device according to claim 2, wherein a temperature of the stacked bodies is 450 to 600° C. in the supplying of the inorganic silicon source.

4. The method for manufacturing the semiconductor memory device according to claim 1, wherein disilane is used as the inorganic silicon source.

5. The method for manufacturing the semiconductor memory device according to claim 4, wherein a temperature of the stacked bodies is 300 to 450° C. in the supplying of the inorganic silicon source.

6. The method for manufacturing the semiconductor memory device according to claim 1, wherein dichlorosilane is used as the inorganic silicon source.

7. The method for manufacturing the semiconductor memory device according to claim 6, wherein a temperature of the stacked bodies is 550 to 750° C. in the supplying of the inorganic silicon source.

8. The method for manufacturing the semiconductor memory device according to claim 1, wherein hexachlorodisilane is used as the inorganic silicon source.

9. The method for manufacturing the semiconductor memory device according to claim 8, wherein a temperature of the stacked bodies is 450 to 650° C. in the supplying of the inorganic silicon source.

10. The method for manufacturing the semiconductor memory device according to claim 1, wherein the metal electrode is formed of at least one type of material selected from the group consisting of tungsten, molybdenum, titanium, tantalum, aluminum, an alloy of these metals, a silicide compound of these metals, a nitride of these metals, and a carbide of these metals.

11. The method for manufacturing the semiconductor memory device according to claim 1, further comprising exposing the side surface of the stacked bodies to a hydrogen atmosphere prior to the supplying of the inorganic silicon source.

* * * * *